United States Patent
Schimmel et al.

(10) Patent No.: US 8,319,200 B2
(45) Date of Patent: Nov. 27, 2012

(54) RADIATION SOURCE, LITHOGRAPHIC APPARATUS AND DEVICE MANUFACTURING METHOD

(75) Inventors: Hendrikus Gijsbertus Schimmel, Utrecht (NL); Vadim Yevgenyevich Banine, Helmond (NL); Erik Roelof Loopstra, Eindhoven (NL); Karel Joop Bosschaart, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 186 days.

(21) Appl. No.: 12/540,559

(22) Filed: Aug. 13, 2009

(65) Prior Publication Data

US 2010/0038562 A1 Feb. 18, 2010

Related U.S. Application Data

(60) Provisional application No. 61/136,132, filed on Aug. 14, 2008, provisional application No. 61/193,800, filed on Dec. 24, 2008.

(51) Int. Cl.
*H05G 2/00* (2006.01)

(52) U.S. Cl. ............ 250/504 R; 250/492.1; 250/492.2; 250/503.1

(58) Field of Classification Search ............... 250/492.1, 250/492.2, 503.1, 504 R
See application file for complete search history.

(56) References Cited

U.S. PATENT DOCUMENTS

| 2006/0250599 A1* | 11/2006 | Bakker et al. | 355/67 |
| 2007/0158597 A1* | 7/2007 | Fomenkov et al. | 250/504 R |
| 2007/0170377 A1* | 7/2007 | Nakano | 250/504 R |

OTHER PUBLICATIONS

Dhiman, S. et al., "Freezing-induced splashing during impact of molten metal droplets with high Weber number", International Journal of Heat and Mass Transfer 48 (2005), pp. 5625-5638.
McDonald, A et al., "Impact of plasma-sprayed metal particles on hot and cold glass surfaces", Thin Solid Films 514 (2006) pp. 212-222.

* cited by examiner

*Primary Examiner* — Michael Maskell
*Assistant Examiner* — Hanway Chang
(74) *Attorney, Agent, or Firm* — Pillsbury Winthrop Shaw Pittman LLP

(57) ABSTRACT

A radiation source is configured to generate extreme ultraviolet radiation. The radiation source includes a laser constructed and arranged to generate a beam of radiation directed to a plasma generation site where a plasma is generated when the beam of radiation interacts with a fuel, an optical component having a surface that is arranged and positioned to be hit by a droplet of fuel, and a temperature conditioner constructed and arranged to elevate the temperature of the surface.

18 Claims, 5 Drawing Sheets

Figure 2
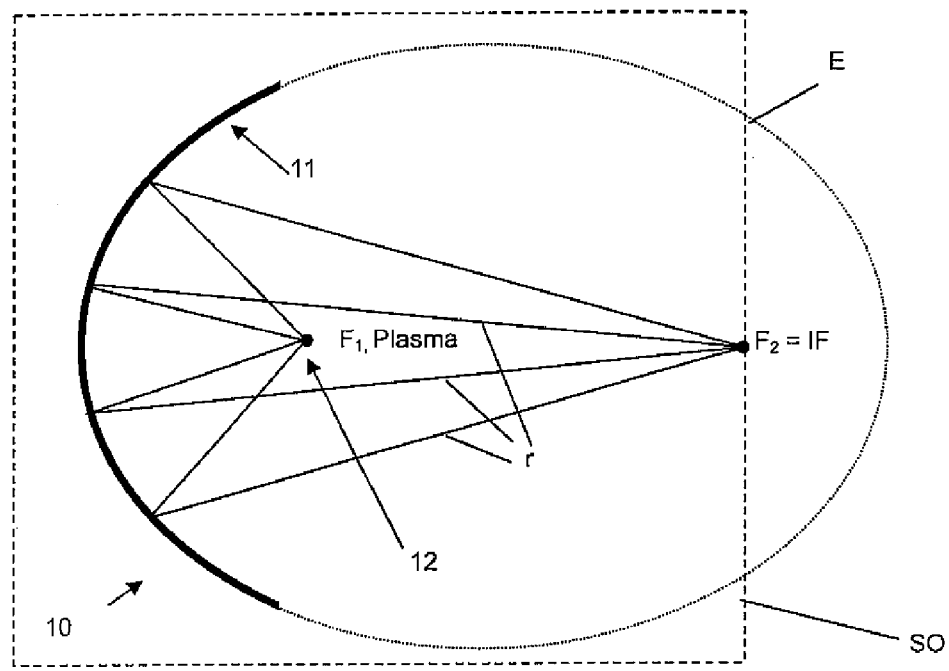
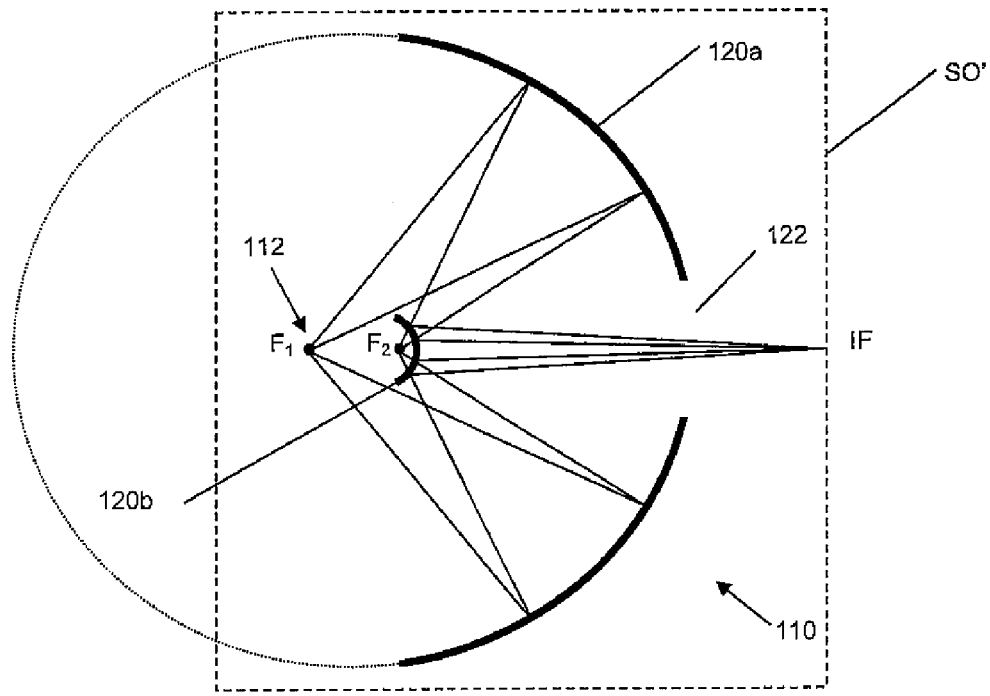
Figure 3

RADIATION SOURCE, LITHOGRAPHIC APPARATUS AND DEVICE MANUFACTURING METHOD

CROSS-REFERENCE TO RELATED APPLICATIONS

This application claims the benefit of priority from U.S. Provisional Patent Application Ser. Nos. 61/136,132, filed on Aug. 14, 2008, and 61/193,800, filed on Dec. 24, 2008, the contents of both of which are incorporated herein by reference in their entireties.

FIELD

The present invention relates to a radiation source, a lithographic apparatus, and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source that produces extreme ultraviolet radiation having a wavelength within the range of 10-20 nm, desirably within the range of 13-14 nm. Thus, EUV radiation sources may constitute a significant step toward achieving small features printing. Such radiation is termed extreme ultraviolet or soft x-ray, and possible sources include, for example, laser produced plasma sources, discharge plasma sources, or synchrotron radiation from electron storage rings.

For a laser produced plasma (LPP) EUV source, a droplet stream of fuel, such as tin (Sn), is heated by a strong laser beam (beam of radiation) to create a plasma that generates radiation in the EUV range. When the strong laser beam hits the droplet, the droplet may be deflected due to the forces generated by the expanding plasma at one side of the droplet. The droplet may also be split up into smaller fragments.

For a discharge produced plasma (DPP) EUV sources a pinch is formed by an electrical current running between two electrodes and a thin film of liquid fuel, such as Sn, being exposed to the electrical current running between the two electrodes. The impact of the high electrical current on the liquid film is thought to produce Sn droplets, which have been observed in DPP sources.

It is desirable to manage the fuel droplets in a manner that reduces potential contamination of other surfaces within the radiation source and other parts of the lithographic apparatus.

SUMMARY

According to an embodiment of the present invention, there is provided a radiation source that is configured to generate extreme ultraviolet radiation. The radiation source includes a laser constructed and arranged to generate a beam of radiation directed to a plasma generation site where a plasma is generated when the beam of radiation interacts with a fuel, an optical component having a surface that is arranged and positioned to be hit by a droplet of fuel, and a temperature conditioner constructed and arranged to elevate the temperature of the surface. The fuel may comprise tin. In an embodiment, e.g. in case of an LPP source, a fuel droplet generator is constructed and arranged to generate the stream of droplets and direct the stream to the plasma generation site. Also in a DPP source, a fuel droplet generator may be present that injects the droplets at a plasma generation site between a pair of electrodes. At the plasma generation site, the laser evaporates the droplets, and an electric discharge is initiated by a voltage between the electrodes. In another type of DPP source, a fuel droplet generator is absent. Instead, the fuel is carried along by rotating electrodes. A laser may be used to evaporate the fuel to enable a discharge between the electrodes through the evaporated fuel. In this type of source fuel droplets are generated as a by-product.

According to an embodiment of the present invention, there is provided a radiation source that is configured to generate extreme ultraviolet radiation. The radiation source includes a laser constructed and arranged to generate a beam of radiation directed to a plasma generation site where a plasma is generated when the beam of radiation interacts with a fuel, and an optical component having a surface that is arranged and positioned to be hit by a droplet of fuel. A coating is provided on the surface. The coating is configured to alter at least one property of the surface. As in the previous embodiment droplets of fuel may be generated by a fuel droplet generator that is constructed and arranged to generate the stream of droplets and direct the stream to a plasma generation site and/or droplets may result as a by-product.

According to an embodiment of the present invention, there is provided a radiation source that is configured to generate extreme ultraviolet radiation. The radiation source includes a laser constructed and arranged to generate a beam of radiation directed to a plasma generation site where a plasma is generated when the beam of radiation interacts with a fuel, an optical component comprising a surface that is arranged and positioned to be hit by a droplet of fuel, and an energy source constructed and arranged to prevent the droplet of fuel from solidifying or to evaporate the droplet of fuel before the droplet of fuel hits the surface. As in the previous embodiments droplets of fuel may be generated by a fuel droplet generator that is constructed and arranged to generate the stream of droplets and direct the stream to a plasma generation site and/or droplets may result as a by-product.

According to an embodiment of the present invention, there is provided a lithographic apparatus that includes a radiation source configured to generate extreme ultraviolet radiation. The radiation source includes a laser constructed and arranged to generate a beam of radiation directed to a plasma generation site where a plasma is generated when the beam of radiation interacts with a fuel, an optical component having a surface that is arranged and positioned to be hit by a droplet of fuel, and a temperature conditioner constructed and arranged to elevate the temperature of the surface. The apparatus also includes a support constructed and arranged to support a patterning device. The patterning device is configured to pattern radiation that passes through an intermediate focus. The apparatus also includes a projection system constructed and arranged to project the patterned radiation onto a substrate.

According to an embodiment of the present invention, there is provided a lithographic apparatus that includes a radiation source configured to generate extreme ultraviolet radiation. The radiation source includes a laser constructed and arranged to generate a beam of radiation directed to a plasma generation site where a plasma is generated when the beam of radiation interacts with a fuel, an optical component having a surface that is arranged and positioned to be hit by a droplet of fuel. A coating is provided on the surface. The coating is configured to alter at least one property of the surface. The apparatus also includes a support constructed and arranged to support a patterning device. The patterning device is configured to pattern radiation that passes through the intermediate focus. The apparatus also includes a projection system constructed and arranged to project the patterned radiation onto a substrate.

According to an embodiment of the present invention, there is provided a lithographic apparatus that includes a radiation source configured to generate extreme ultraviolet radiation. The radiation source includes a laser constructed and arranged to generate a beam of radiation directed to a plasma generation site where a plasma is generated when the beam of radiation interacts with a fuel, an optical component comprising a surface that is arranged and positioned to be hit by a droplet of fuel, and an energy source constructed and arranged to prevent the droplet of fuel from solidifying or to evaporate the droplet of fuel before the droplet of fuel hits the surface. The apparatus also includes a support constructed and arranged to support a patterning device. The patterning device is configured to pattern radiation that passes through an intermediate focus. The apparatus also includes a projection system constructed and arranged to project the patterned radiation onto a substrate.

According to an embodiment of the present invention, there is provided a device manufacturing method that includes providing fuel to a plasma formation site in a radiation source, generating a plasma by providing a beam of radiation to the plasma formation site so that the beam of radiation interacts with the fuel, and elevating a temperature of a surface of an optical component that is arranged and positioned to be hit by a droplet of fuel. The method also includes collecting extreme ultraviolet radiation from the plasma with a collector, reflecting the extreme ultraviolet radiation to an intermediate focus with the collector, patterning the extreme ultraviolet radiation that passes through the intermediate focus with a patterning device, and projecting the patterned extreme ultraviolet radiation onto a substrate. The method also includes reflecting the extreme ultraviolet radiation to an intermediate focus with the collector, patterning the extreme ultraviolet radiation that passes through the intermediate focus with a patterning device, and projecting the patterned extreme ultraviolet radiation onto a substrate.

According to an embodiment of the present invention, there is provided a device manufacturing method that includes providing fuel to a plasma formation site in a radiation source, generating a plasma by providing a beam of radiation to the plasma formation site so that the beam of radiation interacts with the fuel, and altering a surface of an optical component that is arranged and positioned to be hit by a droplet of fuel so that the droplet of fuel does not splash when the surface is hit by the droplet of fuel. The method also includes collecting extreme ultraviolet radiation from the plasma with a collector, reflecting the extreme ultraviolet radiation to an intermediate focus with the collector, patterning the extreme ultraviolet radiation that passes through the intermediate focus with a patterning device, and projecting the patterned extreme ultraviolet radiation onto a substrate.

According to an embodiment of the present invention, there is provided a device manufacturing method that includes providing fuel to a plasma formation site in a radiation source, generating a plasma by providing a beam of radiation to the plasma formation site so that the beam of radiation interacts with the fuel, and providing an energy source configured to prevent a droplet of fuel from solidifying or to evaporate the droplet of fuel before the droplet of fuel hits a surface of an optical component that is arranged and positioned to be hit by a droplet of fuel. The method also includes collecting extreme ultraviolet radiation from the plasma with a collector, reflecting the extreme ultraviolet radiation to an intermediate focus with the collector, patterning the extreme ultraviolet radiation that passes through the intermediate focus with a patterning device, and projecting the patterned extreme ultraviolet radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a radiation source having a normal incidence collector in accordance with an embodiment of the invention;

FIG. 3 depicts a radiation source having a Schwarzschild type normal incidence collector in accordance with an embodiment of the invention;

DETAILED DESCRIPTION

Figure 1:
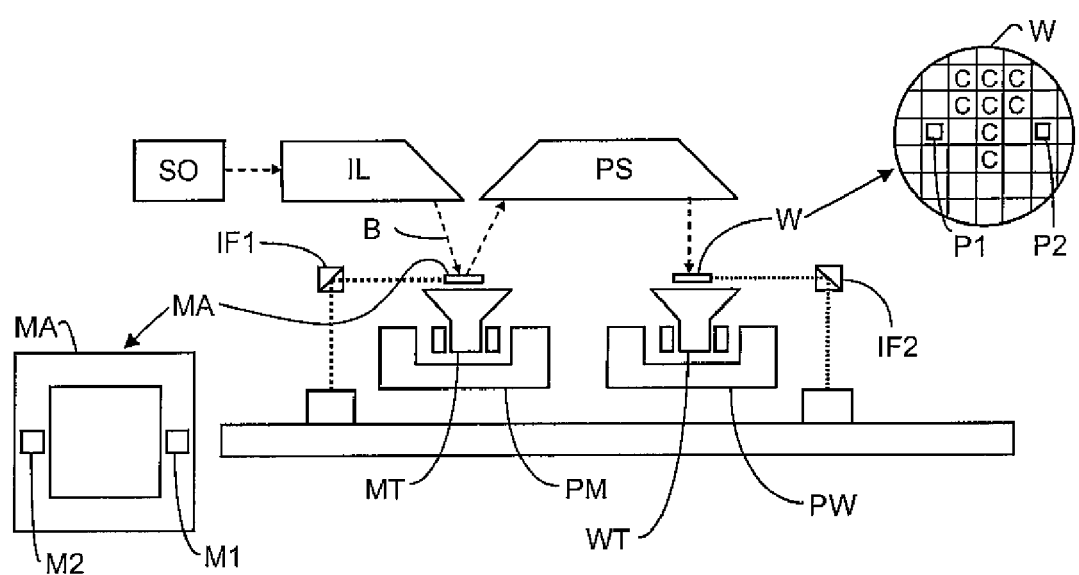
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. EUV radiation); a support structure or support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 shows an embodiment of a radiation source unit SO, in cross-section, that includes a normal incidence collector 10. The collector 10 has an elliptical configuration, having two natural ellipse focus points F1, F2. Particularly, the normal incidence collector includes a collector having a single radiation collecting surface 11 having the geometry of the section of an ellipsoid. In other words: the ellipsoid radiation collecting surface section extends along a virtual ellipsoid (part of which is depicted by as dotted line E in the drawing).

As will be appreciated by the skilled person, in case the collector mirror 10 is ellipsoidal (i.e., including a reflection surface 11 that extends along an ellipsoid), it focuses radiation from one focal point F1 into another focal point F2. The focal points are located on the long axis of the ellipsoid at a distance $f=(a^2-b^2)^{1/2}$ from the center of the ellipse, where $2a$ and $2b$ are the lengths of the major and minor axes, respectively. In case that the embodiment shown in FIG. 1 includes an LPP radiation source SO, the collector may be a single ellipsoidal mirror as shown in FIG. 2, where a plasma formation site 12 is positioned in one focal point (F1) and an intermediate focus IF is established in the other focal point (F2) of the mirror. Radiation emanating from the plasma generated at the plasma formation site 12, located in the first focal point (F1), towards the reflecting surface 11 and the reflected radiation, reflected by that surface towards the second focal point F2, is depicted by lines r in the drawing. For example, according to an embodiment, a mentioned intermediate focus IF may be located between the collector and an illumination system IL (see FIG. 1) of the lithographic apparatus, or be located in the illumination system IL, if desired.

FIG. 3 schematically shows a radiation source SO in accordance with an embodiment of the invention, in cross-section, that includes a collector 110. In this case, the collector 110 includes two normal incidence collector parts 120a, 120b, each part 120a, 120b desirably (but not necessarily) having a substantially ellipsoid radiation collecting surface section. Particularly, the embodiment of FIG. 3 includes a Schwarzschild collector design, desirably consisting of two mirrors 120a, 120b. A plasma formation site (or pinch) 112 may be located in a first focal point F1. For example, the first collector mirror part 120a may have a concave reflecting surface (for example of ellipsoid or parabolic shape) that is configured to focus radiation emanating from the first focal point F1 towards the second collector mirror part 120b, particularly towards a second focus point F2. The second mirror part 120b may be configured to focus the radiation that is directed by the first mirror part 120a towards the second focus point F2, towards a further focus point IF (for example an intermediate focus). The first mirror part 120a includes an aperture 122 through which the radiation (reflected by the second mirror 120b) may be transmitted towards the further focus point IF. The embodiment of FIG. 3 may beneficially be used in combination with a DPP radiation source.

Figure 4:
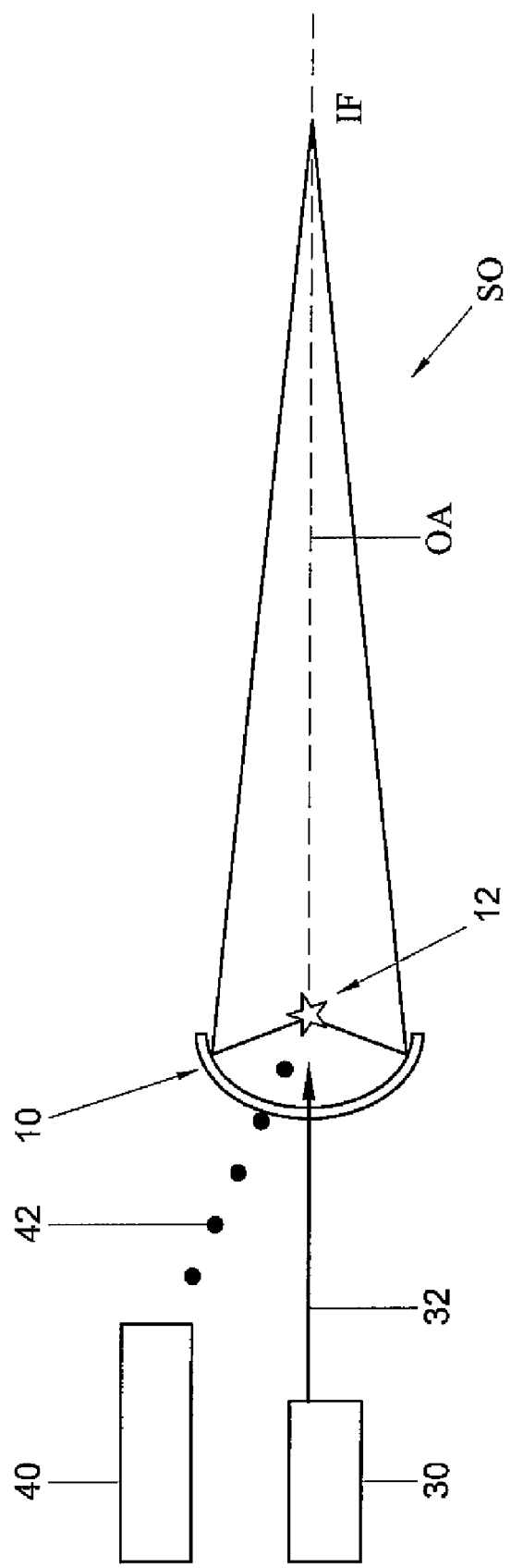
FIG. 4 depicts a schematic view of an embodiment of a laser produced plasma radiation source of the lithographic apparatus of FIG. 1.

FIG. 4 illustrates an embodiment of the source SO, which is a LPP source. Although an LPP source is illustrated, it is understood that principles described herein will also apply to a DPP source. In the illustrated embodiment, a laser 30 is configured to generate a laser beam 32 of coherent light (radiation), having a predetermined wavelength. The beam 32 of radiation (i.e., light) from the laser 30 is focused onto a fuel (the fuel for example being supplied by a fuel supplier 40, and for example including fuel droplets 42) to generate a plasma and radiation therefrom, in the laser produced plasma process. The resulting radiation includes EUV radiation. In a non-limiting embodiment, the laser source may be a so-called $CO_2$ laser that produces a so-called $CO_2$ laser beam, and the fuel may be tin (Sn), or may be a different type of fuel, as will be appreciated by the skilled person.

The plasma formed at the plasma formation site 12 may be configured to emit diverging radiation, and the collector 10 may be arranged to reflect the diverging radiation to provide a converging radiation beam that converges towards the intermediate focus IF along an optical axis OA.

As used herein, the term "droplet" refers to a liquid fuel particle and the term "fragment" refers to a solid fuel particle. The droplets or fragments that are formed by an LPP or DPP source tend to deposit onto the surface 11 of the collector 10. Since the lifetime of future collectors will desirably be larger than 1e12 shots, even a very small chance that a droplet will hit the collector 10 may limit the collector lifetime. For example even a very small chance per pulse of 1% that one droplet with a diameter of 10 μm will hit the collector surface may reduce the collector lifetime (based on 10% reflectivity loss and a collector surface area of 0.32 m²) to 4e10 shots, a factor of 25 below target lifetime.

As illustrated in FIG. 4, in an embodiment, the droplet stream is directed such that the droplets 42 in the plasma formation site 12 have an initial momentum away from the collector 10. Because an additional momentum will be provided to the droplets 42 due to the laser pulse impact on the droplets 42 in a direction that is away from the laser pulse 32, it is desirable to align the droplet generator 40 and the laser beam 32 as much as possible with the optical axis OA of the source SO. Accordingly, the collector 10 is arranged at a location between the source of the laser beam 32 here the laser 30, and the plasma formation site 12. In this way the laser beam 32 has a direction away from the collector 10 in the plasma formation site 12. The source of the laser beam 32 may alternatively be a mirror that reflects the laser beam so that it has a direction away from the collector 10 when it arrives at the plasma formation site 12. In an embodiment, the direction of the laser beam and of the droplet stream is generally from the collector 10 towards the intermediate focus IF.

In an embodiment of the present invention, the fuel droplets and fragments are directed such that they do not unintentionally hit surfaces within the source SO or in other parts of the lithographic apparatus, such as the illuminator IL. Droplets or fragments, though being directed away from the collector 10, will eventually hit a surface of another optical component. It has been observed that hitting surfaces may lead to extensive splashing (i.e. breaking up into smaller droplets) or further fragmentation of the droplets. The directions of these scattered droplets or fragments may be arbitrary and many of them may therefore hit the collector 10. In the case of grazing incidence collectors, these droplets may not only adhere to the surface of the collector, but may also be reflected towards the intermediate focus, and thus may pass into the illuminator IL and mirrors within the illuminator, which is undesirable.

Figure 5:
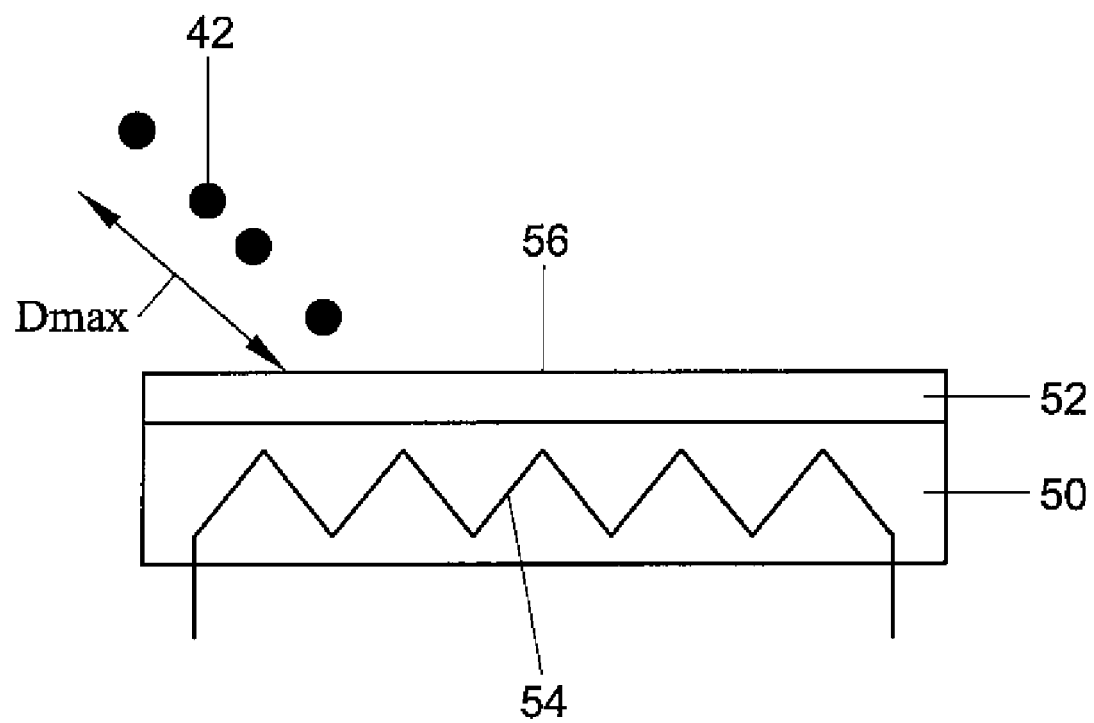
FIG. 5 depicts a schematic view of an embodiment of a surface of the radiation source of FIG. 4.

In an embodiment illustrated in FIG. 5, the surface properties of all of the surfaces, e.g. a surface 56 of a mirror 50 that may be hit by droplets 42 may be adjusted such that the droplets do not splash once they hit the surface. In general, it has been observed that a colder surface appears to create more splashing as compared to a warmer surface. It has been found that Sn droplets that hit rotating foil traps in DPP sources (which are hot, i.e., the temperature of the foils is typically above the melting point of Sn) do not splash, because the transmission of the static foil trap in the DPP source remains high. In an embodiment of the present invention, the temperature of the surfaces close to the droplet path are elevated with a surface temperature conditioner (or conditioning system) 54. The surface temperature conditioner 54 may include a heater, which may include a coil, as illustrated in FIG. 5. In an embodiment, the temperature of the surface may be elevated between room temperature and the melting point of Sn when Sn is used as the fuel. In this embodiment solid Sn that deposits on the surfaces may be removed by periodically heating the surface 56 to temperatures above the melting point of Sn. Further, the surfaces 56 can be heated to a temperature above the melting point of Sn. It has been found that heating the surface 56 reduces splattering of the droplets from the surface. If desired, a still further reduction of splattering can be achieved by reducing a speed with which the droplets approach the surface 56.

In an embodiment, the first surface that the droplet may come into contact with may be placed close enough to the hot zone (i.e., the zone around the plasma formation site 12) such that the droplet 42 is still liquid when it hits the surface 56.

In an embodiment, the material 52 of the surface 56 that may be hit by the droplets 42 may be selected to be a material having a high or a low heat conductivity and/or heat capacity (the thermal properties are likely governed by the property $\gamma = k \rho c$, with k being the thermal conductivity, $\rho$ being the density and c being the specific heat). In an embodiment, a coating 52 may be applied to the surface to change at least one property of the surface. For example, the coating 52 may include a material having the desired heat conductivity and/or heat capacity. A high thermal conductivity may be advantageous if the surface 56 is heated. In that case, a uniform temperature distribution of the surface 56 may be achieved, so that the entire surface 56 can be kept above the melting temperature of the material of the droplets 42. Alternatively however, if the surface is heated at a temperature below the melting temperature of the material of the droplets 42, it is favorable if the material of the surface 56 has a low heat conductivity. In that case, the material of the droplets 42, which is still liquid when it arrives at the surface 56 will only slowly lose its heat.

In an embodiment, the coating 52 may be applied to the surface of the mirror 50 or other body such that the coating 52 acts as a thermal barrier and/or may change the contact angle of the liquid (e.g., the coating 52 may be liquidphillic or liquidphobic) with the surface to decrease the probability that the droplet 42 will splash once it hits the surface. Typically, it is favorable for the material of the droplets 42 that has condensed at an optical component to flow from the surface as a film. This is achieved with a small contact-angle. However, at some locations of the optical system this may result in a capillary flow between parts of the system. In that case, a large contact-angle is desirable.

Figure 6:
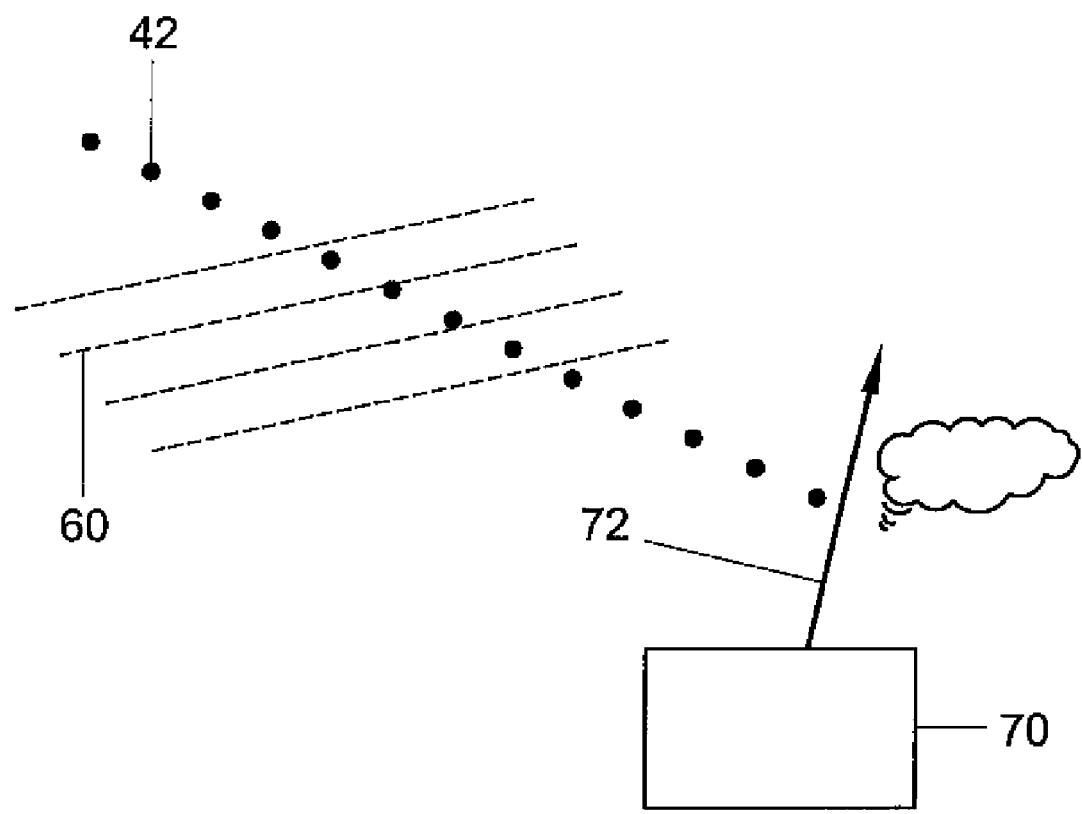
FIG. 6 depicts a schematic view of an embodiment of a portion of the radiation source of FIG. 4.

Fragments (solid fuel particles) may be either reflected or fragmented even further when they hit a surface. In an embodiment illustrated in FIG. 6, the droplets 42 may be kept in a liquid form or may be evaporated before they reach a surface. This may be achieved by placing the first surface in the path of the droplet 42 close enough to droplet generator 40 or the plasma formation site 12 instead of far away. It has been estimated that a 1 µm droplet 42 can solidify after a 0.7 m flight through room temperature hydrogen gas at 100 Pa. This distance depends on the droplet diameter. Therefore, a maximum distance Dmax (FIG. 4) between the droplet generation point and the first surface may be defined. Droplet solidification may also be prevented by having a hot gas area or zone 60 provided with a gas with a temperature higher than the melting point of the droplet 42 along the droplet flight path. An energy source may be used to ensure the gas has a sufficient temperature to prevent the droplet 42 from solidifying before the droplet reaches the surface. For a very high temperature of the gas through which the droplets travel, enough energy may be supplied by the energy source to the droplet 42 so that it evaporates completely before it reaches a surface. This may be especially useful for droplets traveling into the direction of the collector. Heating of the droplet, either to prevent solidification or to evaporate the droplet, may also be done on purpose, e.g. by using an energy source 70 that includes an electron gun (for generating an electron beam 72) or a source, e.g. a laser for providing a very intense light beam, as illustrated in FIG. 6.

Embodiments of the present invention described herein may increase the life of the collector, may reduce or even eliminate the desire for using aggressive chemical agents to etch away the droplets, and may reduce or even eliminate the desire for a rotating foil trap.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation source configured to generate extreme ultraviolet radiation, the radiation, source comprising:
   a laser constructed and arranged to generate a beam of radiation directed to a plasma generation site where a plasma is generated when the beam of radiation interacts with a fuel;
   a mirror having a surface that is arranged and positioned to be hit by a droplet of fuel; and
   a temperature conditioner constructed and arranged to elevate the temperature of the surface.

2. The radiation source according to claim 1, wherein the temperature conditioner is configured to elevate the temperature of the surface to a level above the melting point of the fuel.

3. The radiation source according to claim 1, wherein the fuel comprises tin.

4. A radiation source configured to generate extreme ultra-violet radiation, the radiation source comprising:
   a laser constructed and arranged to generate a beam of radiation directed to a plasma generation site where a plasma is generated when the beam of radiation interacts with a fuel; and
   a mirror having a surface that is arranged and positioned to be hit by a droplet of fuel, wherein the mirror comprises a coating on the surface, the coating being configured to alter at least one property of the surface.

5. The radiation source according to claim 4, wherein the property is a thermal property.

6. The radiation source according to claim 5, wherein the thermal property is heat conductivity and/or heat capacity.

7. The radiation source according to claim 4, wherein the coating is configured to change a contact angle of the droplet of fuel with the surface.

8. The radiation source according to claim 7, wherein the coating is liquidphillic.

9. The radiation source according to claim 7, wherein the coating is liquidphobic.

10. A radiation source configured to generate extreme ultraviolet radiation, the radiation source comprising:
    a laser constructed and arranged to generate a beam of radiation directed to a plasma generation site where a plasma is generated when the beam of radiation interacts with a fuel;
    a mirror comprising a surface that is arranged and positioned to be hit by a droplet of fuel; and
    an energy source constructed and arranged to prevent the droplet of fuel from solidifying or to evaporate the droplet of fuel before the droplet of fuel hits the surface.

11. The radiation source according to claim 10, wherein the energy source is configured to create a hot gas area between a fuel droplet generator constructed and arranged to generate the droplet of fuel and the surface.

12. The radiation source according to claim 10, wherein the energy source comprises an electron beam or an intense light beam that is configured to strike the droplet of fuel in an area between the fuel droplet generator and the surface.

13. A lithographic apparatus comprising:
    a radiation source configured to generate extreme ultraviolet radiation, the radiation source comprising
      a laser constructed and arranged to generate a beam of radiation directed to a plasma generation site where a plasma is generated when the beam of radiation interacts with a fuel,
      a mirror having a surface that is arranged and positioned to be hit by a droplet of fuel, and
      a temperature conditioner constructed and arranged to elevate the temperature of the surface;
    a support constructed and arranged to support a patterning device, the patterning device being configured to pattern radiation that passes through an intermediate focus; and
    a projection system constructed and arranged to project the patterned radiation onto a substrate.

14. A lithographic apparatus comprising:
    a radiation source configured to generate extreme ultraviolet radiation, the radiation source comprising
      a laser constructed and arranged to generate a beam of radiation directed to a plasma generation site where a plasma is generated when the beam of radiation interacts with a fuel, and
      a mirror having a surface that is arranged and positioned to be hit by a droplet of fuel, wherein the mirror comprises a coating on the surface, the coating being configured to alter at least one property of the surface;

a support constructed and arranged to support a patterning device, the patterning device being configured to pattern radiation that passes through an intermediate focus; and a projection system constructed and arranged to project the patterned radiation onto a substrate.

15. A lithographic apparatus comprising:

a radiation source configured to generate extreme ultraviolet radiation, the radiation source comprising a laser constructed and arranged to generate a beam of radiation directed to a plasma generation site where a plasma is generated when the beam of radiation interacts with a fuel, a mirror comprising a surface that is arranged and positioned to be hit by a droplet of fuel, and an energy source constructed and arranged to prevent the droplet of fuel from solidifying or to evaporate the droplet of fuel before the droplet of fuel hits the surface;

a support constructed and arranged to support a patterning device, the patterning device being configured to pattern radiation that passes through an intermediate focus; and a projection system constructed and arranged to project the patterned radiation onto a substrate.

16. A device manufacturing method comprising:

providing fuel to a plasma formation site in a radiation source;

generating a plasma by providing a beam of radiation to the plasma formation site so that the beam of radiation interacts with the fuel;

elevating a temperature of a surface of a mirror that is arranged and positioned to be hit by a droplet of the fuel;

collecting extreme ultraviolet radiation from the plasma with a collector;

reflecting the extreme ultraviolet radiation to an intermediate focus with the collector;

patterning the extreme ultraviolet radiation that passes through the intermediate focus with a patterning device; and projecting the patterned extreme ultraviolet radiation onto a substrate.

17. A device manufacturing method comprising:

providing fuel to a plasma formation site in a radiation source;

generating a plasma by providing a beam of radiation to the plasma formation site so that the beam of radiation interacts with the fuel;

altering a surface of a mirror that is arranged and positioned to be hit by a droplet of fuel so that the droplet of fuel does not splash when the surface is hit by the droplet of fuel;

collecting extreme ultraviolet radiation from the plasma with a collector;

reflecting the extreme ultraviolet radiation to an intermediate focus with the collector;

patterning the extreme ultraviolet radiation that passes through the intermediate focus with a patterning device; and projecting the patterned extreme ultraviolet radiation onto a substrate.

18. A device manufacturing method comprising:

providing fuel to a plasma formation site in a radiation source;

generating a plasma by providing a beam of radiation to the plasma formation site so that the beam of radiation interacts with the fuel;

providing an energy source configured to prevent a droplet of fuel from solidifying or to evaporate the droplet of fuel before the droplet of fuel hits a surface of a mirror that is arranged and positioned to be hit by a droplet of fuel;

collecting extreme ultraviolet radiation from the plasma with a collector;

reflecting the extreme ultraviolet radiation to an intermediate focus with the collector;

patterning the extreme ultraviolet radiation that passes through the intermediate focus with a patterning device; and projecting the patterned extreme ultraviolet radiation onto a substrate.

* * * * *